United States Patent
Stadler et al.

(10) Patent No.: US 10,017,380 B1
(45) Date of Patent: Jul. 10, 2018

(54) COMBINED LASER DRILLING AND THE PLASMA ETCH METHOD FOR THE PRODUCTION OF A MICROMECHANICAL DEVICE AND A MICROMECHANICAL DEVICE

(71) Applicant: Robert Bosch GmbH, Stuttgart (DE)

(72) Inventors: Jan-Peter Stadler, Pfullingen (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 0 days.

(21) Appl. No.: 15/676,457

(22) Filed: Aug. 14, 2017

(51) Int. Cl.
*G01L 9/00* (2006.01)
*B81C 1/00* (2006.01)
*B81B 1/00* (2006.01)

(52) U.S. Cl.
CPC .......... *B81C 1/00047* (2013.01); *B81B 1/004* (2013.01); *B81B 2201/0235* (2013.01); *B81B 2201/0242* (2013.01); *B81B 2203/0315* (2013.01); *B81B 2207/012* (2013.01); *B81C 2201/0116* (2013.01); *B81C 2201/0132* (2013.01); *B81C 2201/0143* (2013.01); *B81C 2201/0198* (2013.01)

(58) Field of Classification Search
USPC ................ 257/419, 416, 621, 774, E29.324, 257/E23.145, E21.505; 438/50, 52, 463, 438/113, 26, 640
See application file for complete search history.

(56) References Cited

U.S. PATENT DOCUMENTS

| | | | |
|---|---|---|---|
| 2015/0253208 A1* | 9/2015 | Dehe | G01L 1/14 73/777 |
| 2016/0023891 A1* | 1/2016 | Reinmuth | G01L 19/143 257/416 |
| 2016/0031216 A1* | 2/2016 | Friesen | B41J 2/1603 347/44 |
| 2017/0157925 A1* | 6/2017 | Rivas | B41J 2/1433 |

FOREIGN PATENT DOCUMENTS

| | | |
|---|---|---|
| DE | 102011103516 B4 | 1/2015 |
| WO | 2015/120939 A1 | 8/2015 |

* cited by examiner

*Primary Examiner* — Tram H Nguyen
(74) *Attorney, Agent, or Firm* — Norton Rose Fulbright US LLP; Gerard Messina (57) ABSTRACT

A micromechanical device that includes a first substrate, at least one first cavity, and a sealed inlet to the first cavity, the inlet extending through the first substrate. The inlet includes a laser-drilled first subsection and a plasma-etched second subsection, the plasma-etched second subsection having an opening to the first cavity, and the inlet in the first subsection being sealed by a molten seal made of molten mass of at least the first substrate. A combined laser drilling and plasma etching method for manufacturing micromechanical devices is also described.

10 Claims, 9 Drawing Sheets

COMBINED LASER DRILLING AND THE PLASMA ETCH METHOD FOR THE PRODUCTION OF A MICROMECHANICAL DEVICE AND A MICROMECHANICAL DEVICE

FIELD

The present invention is directed to a micromechanical device that includes a first substrate, at least one first cavity, and a sealed inlet to the first cavity, the inlet extending through the first substrate.

BACKGROUND INFORMATION

A method for the targeted setting of an internal pressure in a cavity of a MEMS element is described in PCT Appl. No. WO 2015/120939 A1. A narrow access channel to a MEMS cavity is created in a cap wafer or in a sensor wafer. The cavity is flooded with the desired gas at the desired internal pressure via the access channel. The area around the access channel is subsequently locally heated using a laser. The substrate material hereby liquefies locally, and upon solidification hermetically seals the access channel.

Figure 1:
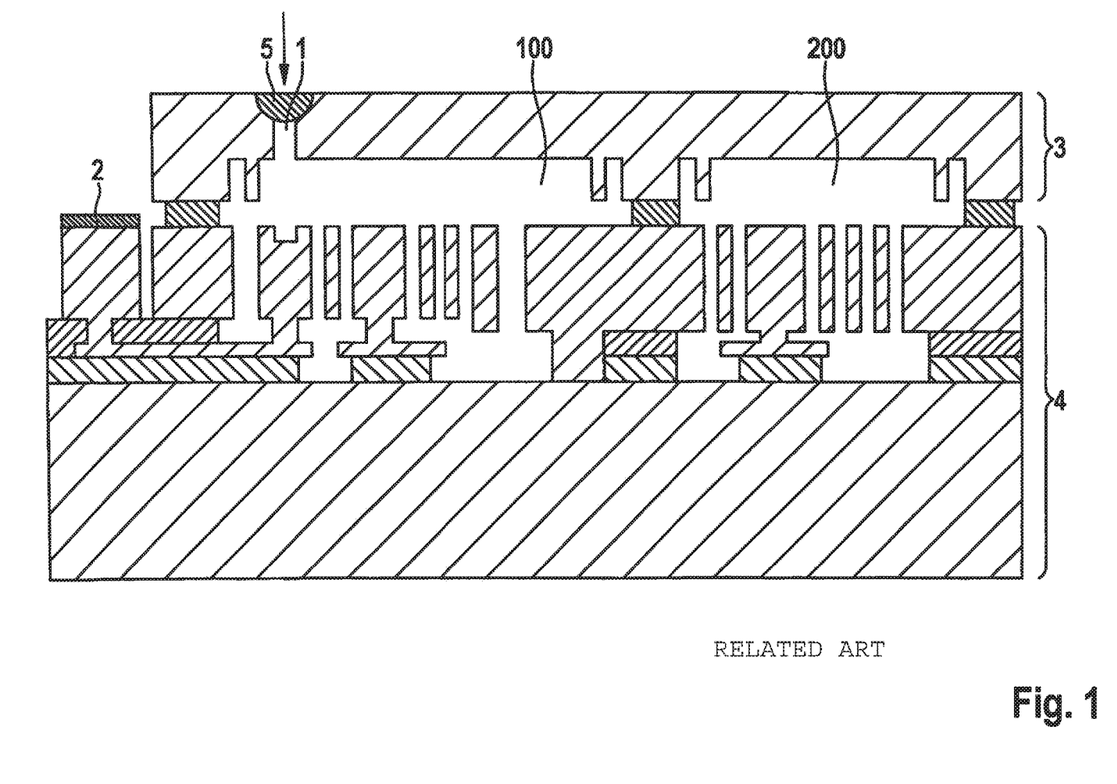
FIG. 1 shows a micromechanical device including a cavity with a sealed inlet from the related art.

Such a method is primarily used when it is desired to create two cavities in a MEMS element, and a different internal pressure is to be provided in the two cavities (FIG. 1).

This is necessary when it is desired to combine, for example, an acceleration sensor with a rotation rate sensor. The acceleration sensor requires a high internal pressure for optimal functioning, whereas a rotation rate sensor requires a rather small internal pressure. This method allows the particular optimal internal pressure to be set in each cavity.

When a very low internal pressure in a cavity is unachievable as the result of outgassing during process control, the method may also be utilized to subsequently set the internal pressure.

In one specific configuration in which only one MEMS element is implemented and the evaluation circuit is provided separately, the creation of access channel (1) may occur at the same time that electrical contact surfaces (2) are exposed. A relatively thin cap wafer is generally used in this type of configuration. After cap wafer (3) is bonded to sensor wafer (4), by use of a photomask and a trenching process it is possible in one step to create a narrow access opening to a first cavity as well as a large access opening to the contact surfaces.

German Patent No. DE 102011103516 B4 describes encapsulating a MEMS structure with a deposited polycrystalline silicon layer, and then creating an access channel into the polycrystalline silicon layer, using a laser drilling process. A defined atmosphere is then set in the MEMS cavity, and the access channel is sealed using a laser sealing process. Creating the access channel is cost-effective compared to a pure trenching process via which only one access channel is created. It is disadvantageous that in a laser drilling process, smoke always arises that may damage the MEMS structures. It is also disadvantageous that the laser drilling process is not very selective for different materials. This means that, regardless of the material, during laser drilling not only is an access hole created through the polycrystalline silicon layer, but at the same time a hole is also drilled into the underlying layer.

SUMMARY

An object of the present invention is to provide a method or a system which allows an access channel to be created in a thick substrate in a cost-effective manner. The access channel should terminate in a cavity, and should produce no smoke or other contaminants there during the manufacturing process. In addition, as soon as the cavity is reached the method should end, with no further drilling into the material situated beneath the cavity. Furthermore, the method is to result in very small access holes on the substrate surface, which may be sealed using a laser melting method.

The present invention is directed to a micromechanical device that includes a first substrate, at least one first cavity, and a sealed inlet to the first cavity, the inlet extending through the first substrate. The inlet includes a laser-drilled first subsection and a plasma-etched second subsection, the plasma-etched second subsection having an opening to the first cavity, and the inlet in the first subsection being sealed by a molten seal made of molten mass of at least the first substrate.

One advantageous embodiment of the present invention provides that the first substrate includes an additional layer, and the inlet is also sealed by molten mass of the additional layer.

The micromechanical device is advantageously a hybrid integrated micromechanical device, the device including a second substrate with an ASIC circuit.

Moreover, the present invention relates to a combined laser drilling method and plasma etching method for manufacturing micromechanical devices.

Smoke in the cavity is advantageously completely avoided with the example method according to the present invention. A costly photomask for the plasma etching method is not necessary. The laser drilling method creates the mask required for the trenching process. The adjustment between the laser drilling method and the trenching process advantageously takes place with the aid of the additional layer in a self-adjusting manner, with shifting being precluded. By combining two ablation processes, namely, laser drilling and trench etching, an overall larger aspect ratio for the access channel may advantageously be achieved. It is advantageously possible to achieve smaller access openings in the laser drilling method by a suitable selection of the additional layer. The additional layer may at the same time be advantageously used for providing a fairly stable laser reseal process, for example due to the fact that the material of the additional layer is easier to melt, or forms a eutectic with the material of the substrate, in particular silicon. The combined laser drilling and plasma etching method according to the present invention, with the defined introduction of a suitable atmosphere and the sealing at any desired location, may advantageously be integrated into the overall MEMS manufacturing process. In particular, this step sequence may also be integrated at the very end of the wafer manufacturing process. Thus, the actual manufacturing process does not have to be modified.

One advantageous embodiment of the example method according to the present invention provides that the additional layer is removed after step c. The additional layer may advantageously be removed directly after step c or in a subsequent method step.

One advantageous embodiment of the example method according to the present invention provides that an atmosphere having a certain composition and a certain pressure is set in the first cavity after step e.

One advantageous embodiment of the example method according to the present invention provides that laser melting of material of the additional layer also takes place in step f.

The inlet is advantageously also sealed by molten mass of the additional layer.

One advantageous embodiment of the example method according to the present invention provides that step c and/or step d are/is carried out essentially at atmospheric pressure.

One advantageous embodiment of the example method according to the present invention provides that the laser drilling is carried out in step c using a first laser or also with first laser operating parameters, in particular with a very short wavelength, or also with a very sharp focus, or also with a very short pulse length, and the laser drilling is carried out in step d using a second laser or also with second laser operating parameters that are different from the first laser operating parameters, in particular with a longer wavelength, or also with a less sharp focus, or also with a longer pulse length.

One advantageous embodiment of the example method according to the present invention provides that the laser drilling is initially carried out in step d with the first laser operating parameters up to a certain depth, and the laser drilling is subsequently carried out with the second laser operating parameters.

DETAILED DESCRIPTION OF EXAMPLE EMBODIMENTS

FIG. 1 shows a micromechanical device including a cavity with a sealed inlet from the related art. A micromechanical device that includes a MEMS wafer 4 and a cap wafer 3 is schematically illustrated. Cap wafer 3 has an access channel 1 that is sealed with a molten seal 5. Electrical contact surfaces 2 are situated in recesses of cap wafer 3. The micromechanical device includes a first cavity 100 that contains a rotation rate sensor, for example, and a second cavity 200 that contains an acceleration sensor, for example. Cavity 200 essentially contains an atmosphere with the pressure and composition of the process gas during bonding of MEMS wafer 4 to cap wafer 3. Good damping of the acceleration sensor is thus ensured. Cavity 100 has been evacuated through inlet 1, and inlet 1 has subsequently been sealed with the aid of a molten seal 5. High quality of the oscillator of the rotation rate sensor is thus ensured. The arrow denotes the effective direction of a laser sealing process for producing molten seal 5.

In one specific configuration of a micromechanical sensor or some other micromechanical device in which only one MEMS element is implemented and the evaluation circuit or some other electrical control circuit is provided separately, access channel 1 may be provided at the same time that electrical contact surfaces 2 are exposed. In such a configuration, a relatively thin cap wafer 3 is generally used. After cap wafer 3 is bonded to sensor wafer 4, a narrow access opening 1 to first cavity 100 as well as a large access opening to contact surfaces 2 may be created in a single step via a photomask and a trenching process.

Creating access opening 1 to first cavity 100 is difficult with thick cap wafers. Access opening 1 must not become too large, since otherwise sealing by localized melting and subsequent solidification is no longer possible. Trenching processes which create very narrow inlets and which at the same time extend very deeply, i.e., which have a high aspect ratio, are difficult, and become increasingly slower and more complex as the aspect ratio increases.

If inlet 1 to first cavity 100 is not created at the same time that contact areas 2 are opened, a separate photomask must be provided for each of the two processes. This is laborious and costly, and sometimes is also technically difficult to implement.

Figure 2A:
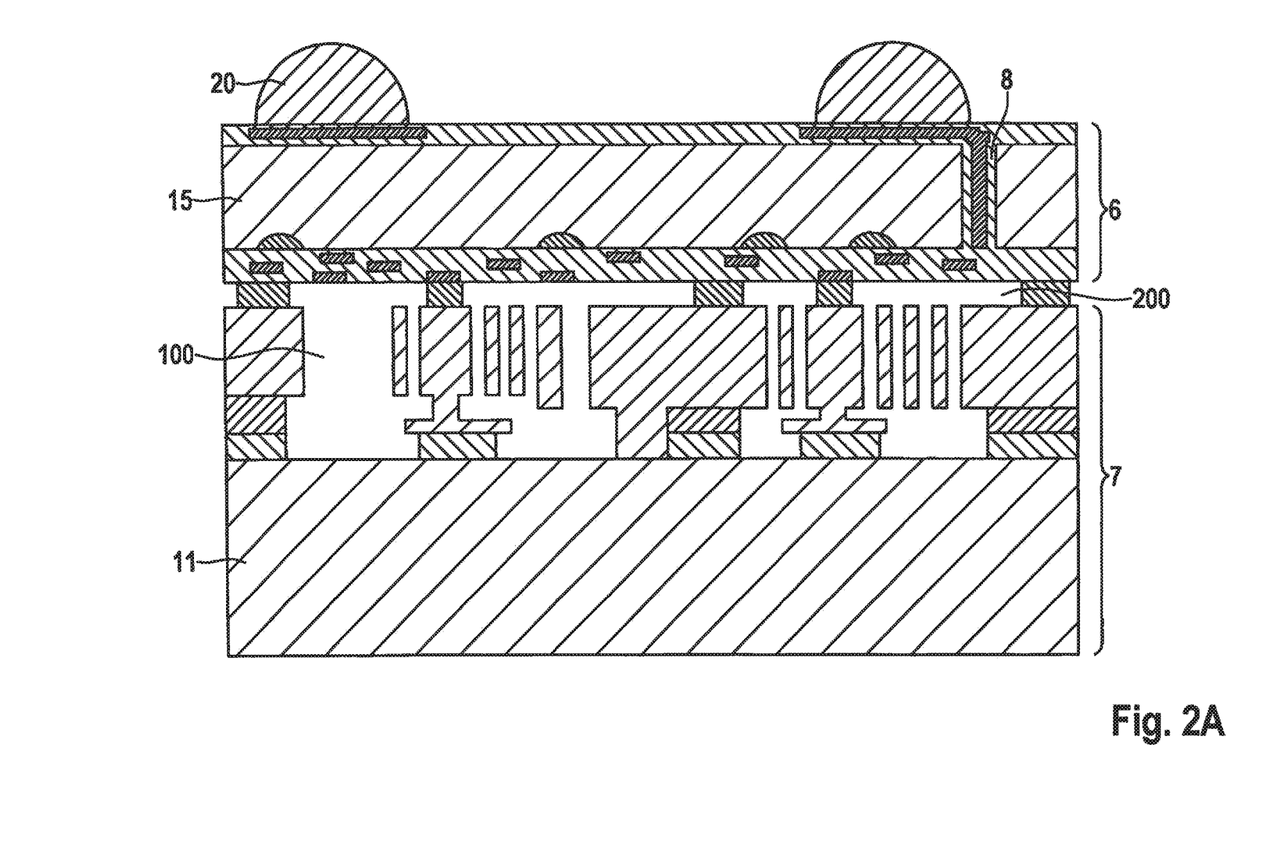
FIGS. 2A through 2G show one exemplary embodiment of the combined laser drilling and plasma etching method according to the present invention for manufacturing a micromechanical device.
Figure 2B:
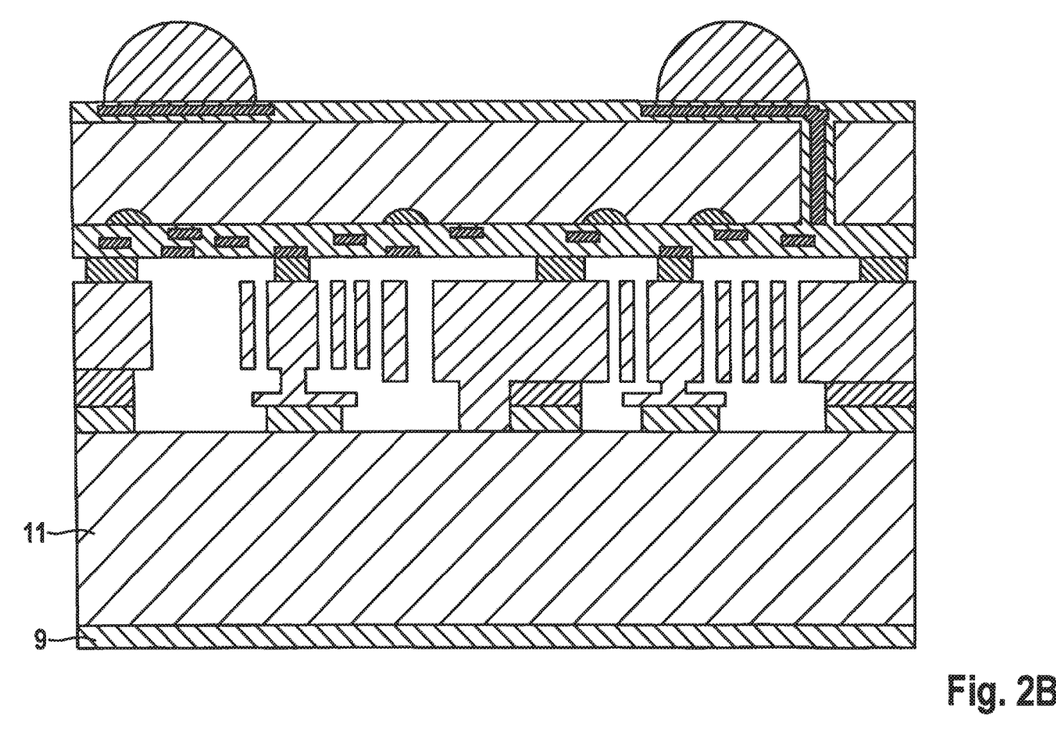
Figure 2C:
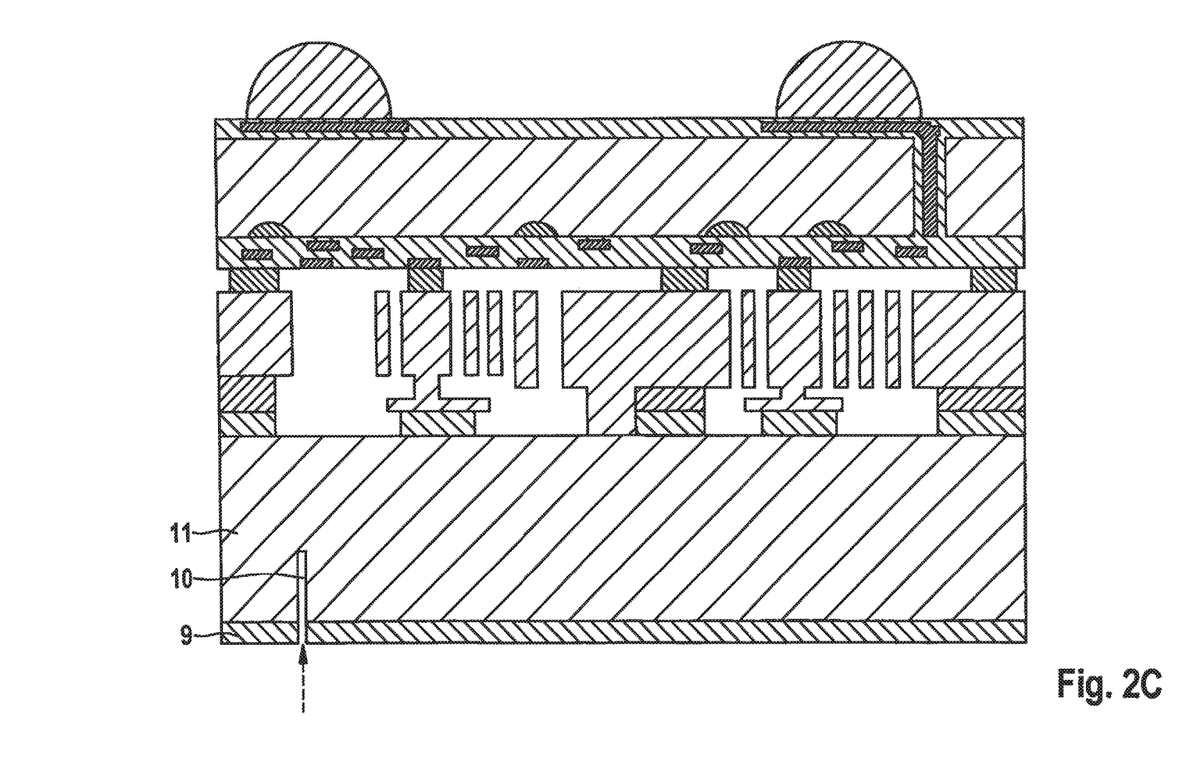
Figure 2D:
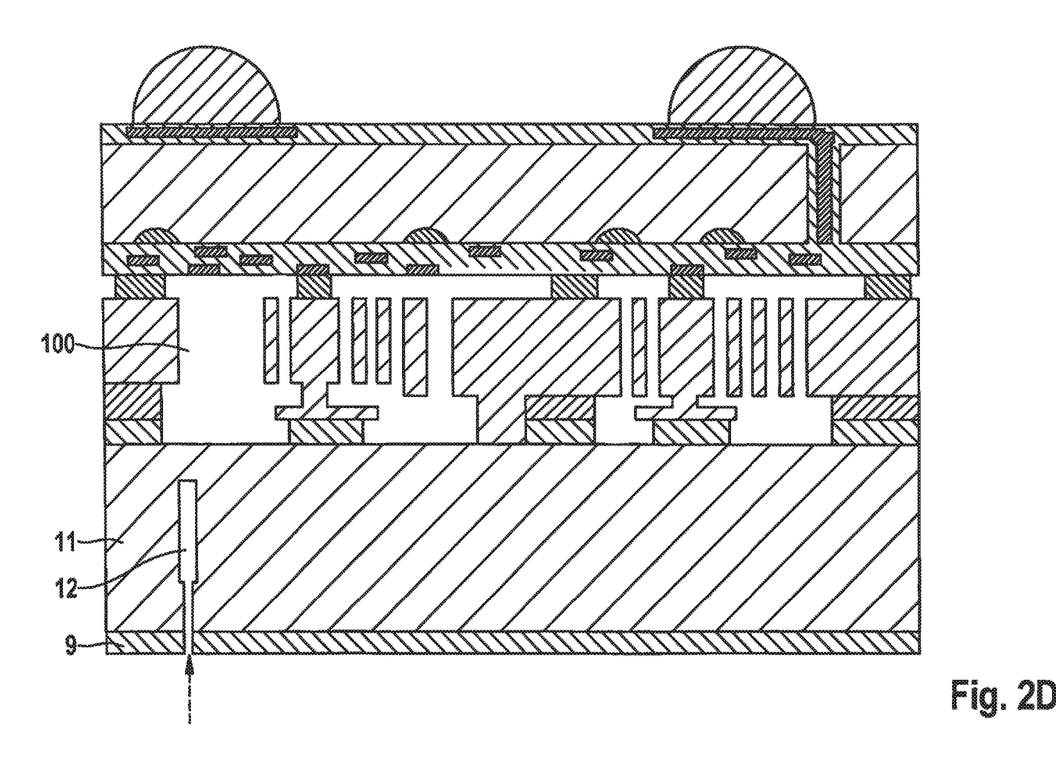
Figure 2E:
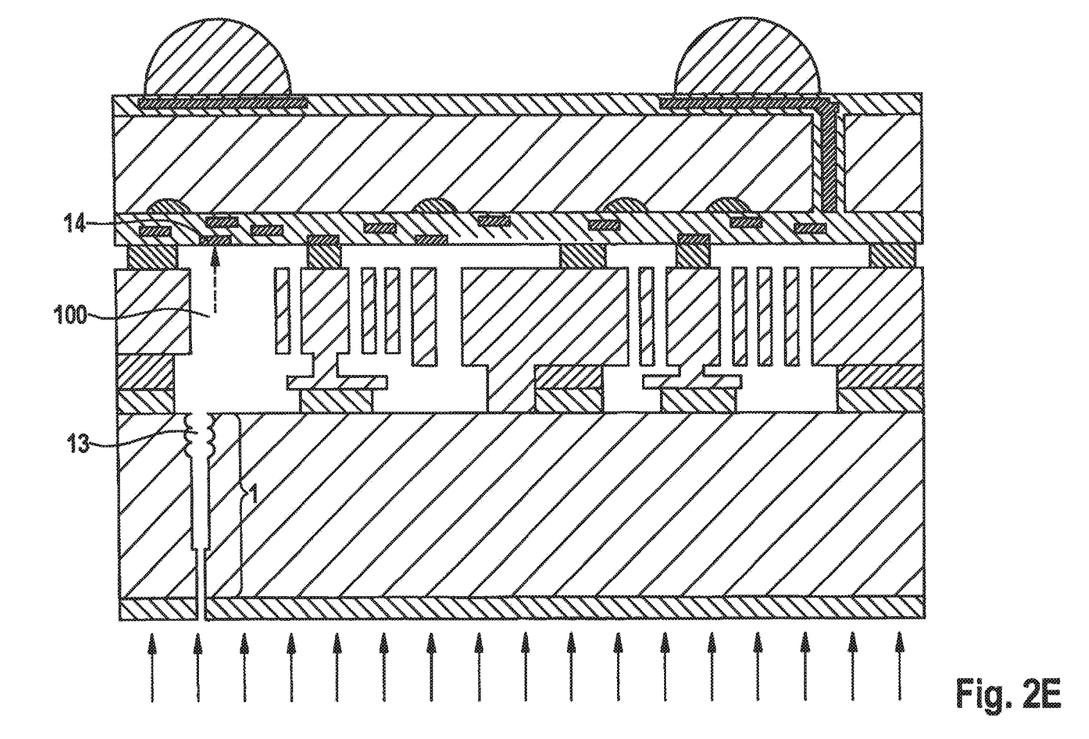

FIGS. 2A through 2G show one exemplary embodiment of the combined laser drilling and plasma etching method according to the present invention for manufacturing a micromechanical device. First of all, FIG. 2A shows a provided wafer composite that includes a MEMS wafer and a substrate with an ASIC evaluation circuit. For so-called hybrid integration applications, at the wafer level a second substrate 15 with an ASIC evaluation circuit 6 is directly combined with a MEMS wafer 7 with a first substrate 11. Alternatively, a MEMS element is applied to the ASIC evaluation circuit, and this wafer is encapsulated with a cap substrate. To obtain a preferably compact component, vias (through-silicon vias (TSVs)) 8 may be provided through ASIC substrate 15 or MEMS substrate 11 to establish an electrical connection between the ASIC circuit, in particular a MEMS sensor evaluation circuit, and the surroundings. FIG. 2B shows the application of an additional layer 9 to first substrate 11. According to FIG. 2C, a hole 10 is drilled into additional layer 9 with pulsed laser energy, using a laser drilling method. According to FIG. 2D, the hole is then deepened into the underlying material of first substrate 11, likewise with a pulsed laser, and is advanced into a first subsection 12 of first substrate 11. Before underlying first cavity 100 is reached, a switch is made to a plasma etching method, in particular a trenching method, as shown in FIG. 2E. Additional layer 9 is used as a mask for the plasma etching method. With this layer as a mask, the plasma etching method is used to etch access channel 1 through a second subsection 13 of first substrate 11 up to first cavity 100, in which a MEMS functional element, for example, is situated. The arrows here denote the effective direction of a trenching method. A stop layer 14 may optionally be provided in the cavity, in particular on a wall of the cavity opposite from access channel 1, so that there is no further etching into the MEMS functional element or the ASIC circuit, or into the second substrate, via the plasma etching method.

Figure 2F:
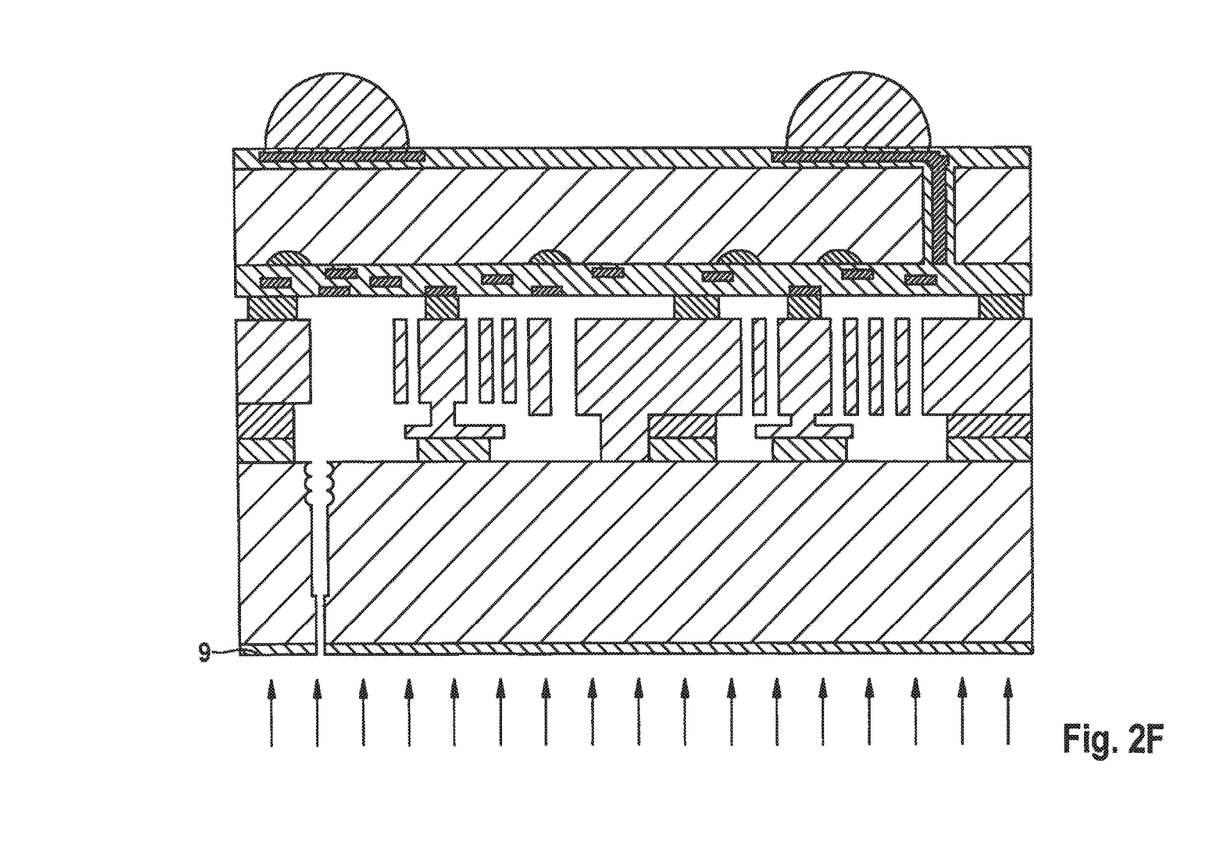
Figure 2G:
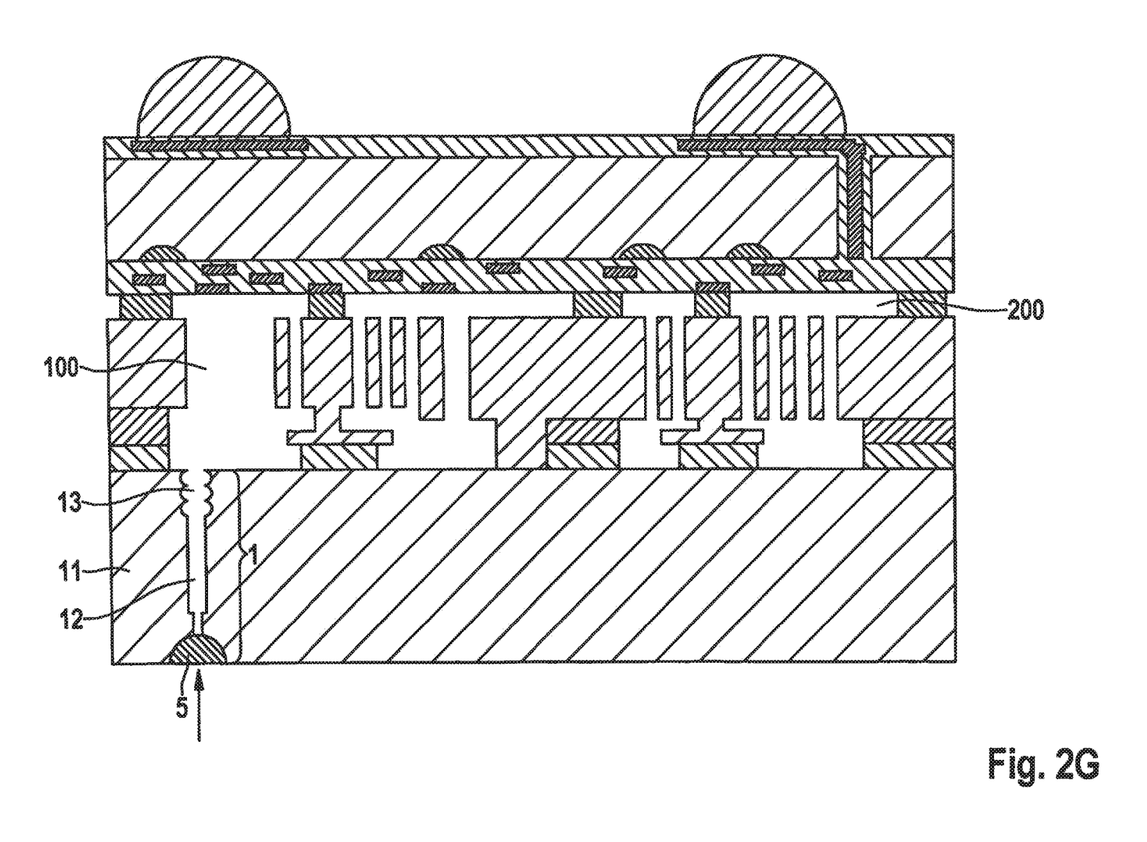

The cavity is then flooded with the desired gas at the desired internal pressure via the access channel. FIG. 2F shows one variant of the method according to the present invention in which additional layer 9 is subsequently removed. Additional layer 9 may be made of oxide, for example, and may be removed by etching. The arrows here denote the effect of an etching process for removing additional layer 9. Alternatively, additional layer 9 may be removed in a subsequent method step, or may remain. Lastly, FIG. 2G shows an area of first substrate 11 around which access channel 1 is locally heated via a laser. The substrate material of first substrate 11 liquefies locally, and upon solidification hermetically seals access channel 1 in laser-drilled first subsection 12 with a molten seal 5. If additional layer 9 has not been removed, a portion of the additional layer may also be heated via the laser. Material of additional layer 9 liquefies locally, and likewise seals access channel 1 upon solidification.

Figure 3:
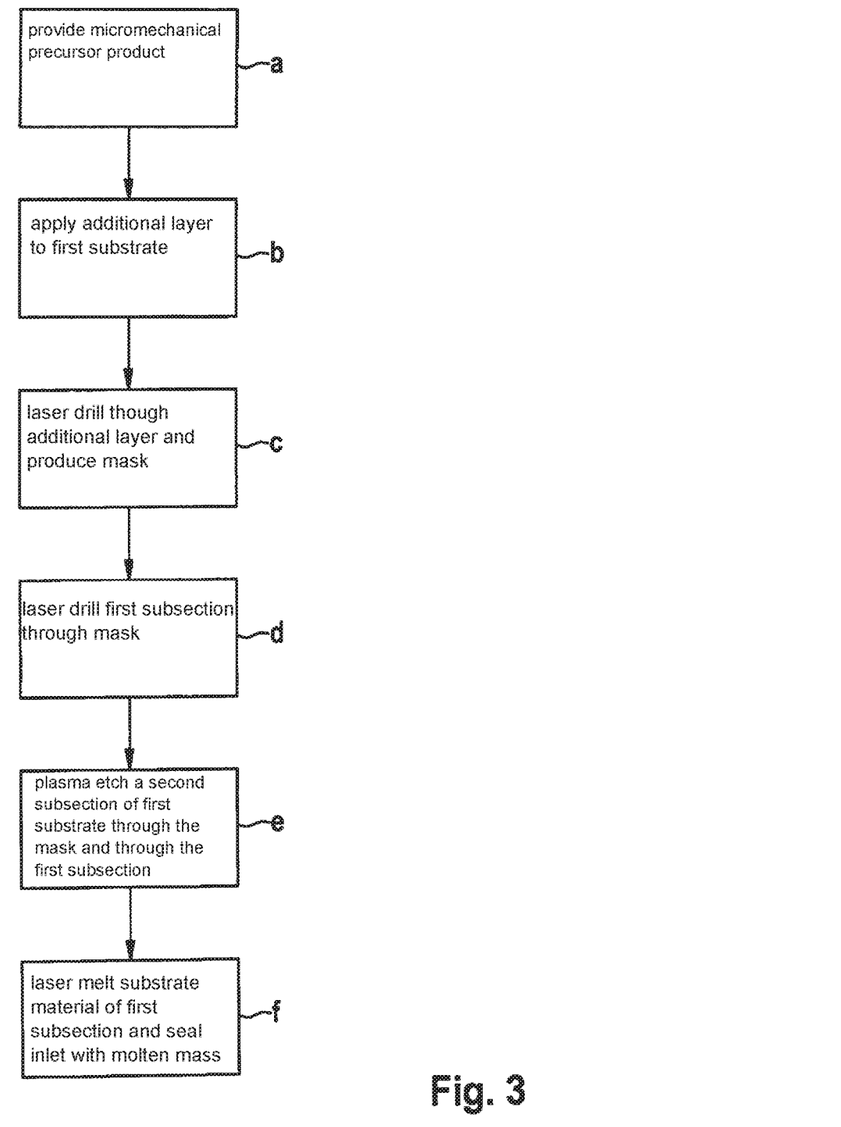
FIG. 3 schematically shows the laser drilling and plasma etching method according to the present invention for manufacturing a micromechanical device.

FIG. 3 schematically shows the laser drilling and plasma etching method according to the present invention for manufacturing a micromechanical device, including the method steps:

a. providing a micromechanical precursor product that includes a first substrate 11 and at least one first cavity 100, first cavity 100 being delimited at least by first substrate 11,
b. applying an additional layer 9 to first substrate 11,
c. laser drilling through additional layer 9 and thus producing a mask,
d. laser drilling of a first subsection 12 of first substrate 11 through the mask,
e. plasma etching of a second subsection 13 of first substrate 11 through the mask and through first subsection 12 in such a way that an inlet 1 through first substrate 11 to cavity 100 is created,
f. laser melting of substrate material of first subsection 12 and sealing inlet 1 with molten mass.

The essential process steps of the method according to the present invention may be summarized as follows:
1. A MEMS wafer stack is provided with at least one additional layer.
2. A blind hole is drilled into the additional layer and the substrate material, using a laser drilling method.
3. The hole is etched farther into the cavity, using a plasma etching method, in particular a trenching method.
4. The additional layer may now optionally be removed (FIG. 2F).
5. The cavity is flooded with the desired gas at the desired internal pressure via the access channel.
6. The area around the access channel is locally heated via a laser, and the substrate material liquefies locally and hermetically seals the access channel upon solidification.

Further Example Embodiments of the Present Invention

It is advantageous to carry out the laser drilling method using two different lasers or laser settings. The first laser drilling method is optimized to drill a hole into the additional layer. For example, a laser having a very short wavelength and with a very sharp focus and/or a very short pulse length may be deliberately used. A very small access hole may thus be created in the additional layer. The second laser drilling method may be optimized to drill a hole into the substrate. In particular, the additional layer and the second laser may be combined in such a way that a portion of the laser power is reflected. For example, a metal layer such as aluminum in particular may be used as the additional layer, and may be combined with a laser wavelength so that a large portion of the light is reflected. Alternatively, a partially transparent layer such as oxide, for example, is used, but is selected in a thickness such that a major portion of the laser light is reflected. Due to such a system, the laser light through the additional layer, in addition to the normal focusing, may be even further spatially localized, thus making it possible to drill very small access channels, also at a great depth. The advantage of this method is that a laser having a longer wavelength and/or a longer pulse length, which allows faster drilling rates, may be used as the second laser drilling method.

Furthermore, with the first laser drilling method it may be advantageous to drill a hole not only into additional layer 9, but also into the upper part of first substrate 11, which is to be subsequently sealed via the melting method. A second laser drilling method, which drills a larger opening and thus operates more quickly, may then be used in the middle part of the substrate. A narrow access opening in the upper substrate area is advantageous for the subsequent sealing process. It is therefore advantageous to drill the first narrow borehole into the substrate as deep as or deeper than the depth of the melting area in the sealing process.

It is also advantageous when the laser drilling method is initially carried out in air, i.e., at atmospheric pressure, to allow simple, cost-effective process control. The plasma etching method is subsequently carried out in a vacuum chamber. The wafer is then directly sealed, using the laser reseal process, without removing the wafer from the vacuum system. The advantage of this sequence is that contaminants cannot enter the cavity during the subsequent venting. In addition, it is not possible for moisture or other absorbent gases to enter the cavity. In some cases it might be possible to remove these gases only by bake-out. Since this process control requires no bake-out, the method according to the present invention may be carried out at any desired location, in particular also at the very end of the process chain for manufacturing a micromechanical device. This is even possible, for example, when solder balls have already been placed on the wafer, and heat treatment is therefore no longer possible.

With the method according to the present invention, the MEMS substrate may also be selected to be much thicker than the ASIC substrate. This is advantageous in particular when the MEMS structures are mechanically coupled to the MEMS substrate.

The method is particularly advantageous for hybrid integrated MEMS elements.

It is advantageous in particular when a MEMS structure is provided on one substrate, and an ASIC evaluation circuit is provided on another substrate, and both substrates are bonded to one another. It is then advantageous to select the inlet through the substrate that includes the MEMS structure according to the described method. In this case, ASIC functional layers such as passivating layers (oxides) or wiring layers (Al or Cu) may be used as an etch stop layer for the plasma etching method without having to apply additional layers in the system.

In particular, the method is advantageous for manufacturing hybrid integrated MEMS elements including at least two cavities with different internal pressures.

Furthermore, the method is advantageous for manufacturing hybrid integrated MEMS elements that are designed as bare die structures, i.e., directly provided with solder balls and not cast into a plastic compound.

LIST OF REFERENCE NUMERALS 1 access channel
2 electrical contact surfaces
3 cap wafer
4 sensor wafer
5 molten seal
6 ASIC wafer
7 MEMS wafer
8 TSV
9 additional layer
10 laser-drilled hole into the additional layer
11 first substrate
12 laser-drilled first subsection of the access channel in the first substrate 13 plasma-etched second subsection of the access channel in the first substrate
14 stop layer
15 second substrate
20 solder ball
100 first cavity
200 second cavity

What is claimed is:

1. A method for manufacturing a micromechanical device, comprising:
   (a) providing a micromechanical precursor product that includes a first substrate and at least one first cavity, the first cavity being delimited at least by the first substrate;
   (b) applying an additional layer to the first substrate;
   (c) laser drilling through the additional layer to produce a mask;
   (d) laser drilling a first subsection of the first substrate through the mask;
   (e) plasma etching a second subsection of the first substrate through the mask and through the first subsection in such a way that an inlet through the first substrate to the cavity is created; and
   (f) laser melting substrate material of the first subsection and sealing the inlet with molten mass.

2. The method as recited in claim 1, wherein the additional layer is removed after step (c).

3. The method as recited in claim 1, wherein an atmosphere having a certain composition and a certain pressure is set in the first cavity after step (e).

4. The method as recited in claim 1, further comprising:
   (f) laser melting material of the additional layer.

5. The method as recited in claim 1, wherein at least one of step (c) and step (d) is carried out at atmospheric pressure.

6. The method as recited in claim 1, wherein the laser drilling is carried out in step (c) with first laser operating parameters, the first operating parameters including at least one of: (i) a very short wavelength, (ii) a very sharp focus, and (iii) a very short pulse length, and the laser drilling is carried out in step (d) with second laser operating parameters that are different from the first laser operating parameters, the second laser operating parameters including at least one of: (i) a longer wavelength, (ii) a less sharp focus, and (iii) a longer pulse length.

7. The method as recited in claim 6, wherein the laser drilling is initially carried out in step (d) with the first laser operating parameters up to a certain depth, and the laser drilling is subsequently carried out with the second laser operating parameters.

8. A micromechanical device, comprising:
   a first substrate;
   at least one first cavity; and
   a sealed inlet to the first cavity, the inlet extending through the first substrate;
   wherein the inlet includes a laser-drilled first subsection and a plasma-etched second subsection, the plasma-etched second subsection having an opening to the first cavity, and the inlet in the first subsection being sealed by a molten seal made of molten mass of at least the first substrate.

9. The micromechanical device as recited in claim 8, wherein the first substrate includes an additional layer, and the inlet is also sealed by molten mass of the additional layer.

10. A hybrid integrated micromechanical device; comprising:
   a first substrate;
   at least one first cavity; and
   a sealed inlet to the first cavity, the inlet extending through the first substrate;
   wherein the inlet includes a laser-drilled first subsection and a plasma-etched second subsection, the plasma-etched second subsection having an opening to the first cavity, and the inlet in the first subsection being sealed by a molten seal made of molten mass of at least the first substrate; and
   wherein the device includes a second substrate with an ASIC circuit.

\* \* \* \* \*